US008237415B2

(12) United States Patent
Iwasaki et al.

(10) Patent No.: US 8,237,415 B2
(45) Date of Patent: Aug. 7, 2012

(54) CONTROL CIRCUIT AND METHOD FOR CAPACITOR CHARGING CIRCUIT

(75) Inventors: Tatsuya Iwasaki, Kyoto (JP); Isao Yamamoto, Kyoto (JP)

(73) Assignee: Rohm Co., Ltd. (JP)

( * ) Notice: Subject to any disclaimer, the term of this patent is extended or adjusted under 35 U.S.C. 154(b) by 873 days.

(21) Appl. No.: 12/255,742

(22) Filed: Oct. 22, 2008

(65) Prior Publication Data

US 2009/0102435 A1  Apr. 23, 2009

(30) Foreign Application Priority Data

Oct. 22, 2007  (JP) ................................. 2007-273822

(51) Int. Cl.
*H02J 7/00* (2006.01)
*H02M 7/5383* (2007.01)
*H05B 41/16* (2006.01)

(52) U.S. Cl. ............ 320/166; 320/140; 363/19; 363/53; 363/80; 363/74; 315/254; 315/274

(58) Field of Classification Search .................... 363/74; 320/166
See application file for complete search history.

(56) References Cited

U.S. PATENT DOCUMENTS

| | | | | |
|---|---|---|---|---|
| 6,137,280 A  * | 10/2000 | Ackermann et al. | ........... | 323/354 |
| 6,262,565 B1 * | 7/2001 | Williams et al. | ............... | 323/237 |
| 6,326,772 B2 * | 12/2001 | Kusumoto et al. | ............ | 320/166 |
| 6,476,586 B2 * | 11/2002 | Yunosawa et al. | ............ | 320/166 |
| 6,862,194 B2 * | 3/2005 | Yang et al. | ....................... | 363/16 |
| 7,019,506 B2 * | 3/2006 | Kernahan | ...................... | 323/284 |
| 2003/0102845 A1* | 6/2003 | Aker et al. | ..................... | 320/139 |
| 2004/0130299 A1* | 7/2004 | Pietkiewicz et al. | .......... | 320/166 |
| 2004/0196669 A1* | 10/2004 | Thrap | .............................. | 363/19 |
| 2006/0077697 A1* | 4/2006 | Yang | ........................... | 363/21.13 |
| 2006/0176119 A1* | 8/2006 | Yonezawa et al. | ........ | 331/113 R |
| 2006/0284567 A1* | 12/2006 | Huynh et al. | .................. | 315/246 |

FOREIGN PATENT DOCUMENTS

| | | |
|---|---|---|
| JP | 2004-201474 | 7/2004 |
| JP | 2005-73483 | 3/2005 |
| JP | 2005-143224 A | 6/2005 |
| JP | 2007-165002 | 6/2007 |
| JP | 2007-166786 | 6/2007 |
| JP | 2000-209854 A | 7/2012 |

OTHER PUBLICATIONS

The First Office Action for Chinese Patent Application No. 200810169449.5, issued May 25, 2012, with English translation.
Notification of Reason(s) for Refusal for Japanese Patent Application No. 2007-273822, mailed Jun. 5, 2012, with English translation.

* cited by examiner

*Primary Examiner* — Yalkew Fantu
(74) *Attorney, Agent, or Firm* — Cantor Colburn LLP (57) ABSTRACT

An output voltage monitoring circuit monitors an output voltage of a capacitor charging circuit. A first sample-and-hold circuit samples and holds a voltage of a connection point of a primary coil of a transformer and a switching transistor. A first monitoring comparator compares output of the first sample-and-hold circuit with a predetermined first reference voltage. When the output of the first sample-and-hold circuit exceeds the first reference voltage, a signal processor executes predetermined signal processing. The first sample-and-hold circuit starts a sampling period after a predetermined first time has elapsed after the switching transistor is turned OFF. When a voltage drop across a detection resistor reaches a third reference voltage, the first sample-and-hold circuit ends the sampling period.

10 Claims, 4 Drawing Sheets

CONTROL CIRCUIT AND METHOD FOR CAPACITOR CHARGING CIRCUIT

BACKGROUND OF THE INVENTION

1. Field of the Invention

The present invention relates to a capacitor charging circuit, and in particular to technology for monitoring output voltage of the capacitor charging circuit.

2. Description of the Related Art

To generate voltage that is higher than input voltage, voltage boosting capacitor charging circuits are widely used in various electronic devices. Such voltage boosting capacitor charging circuits are provided with a switching transistor, and an inductor or a transformer, and by turning the switching transistor ON and OFF in a time-division manner, back electromotive force is generated in the inductor or the transformer, and input voltage is boosted and outputted.

When the switching transistor is turned OFF, a current flows on a primary side of the transformer and energy is stored in the transformer. When the switching transistor is turned OFF, energy stored in the transformer on a secondary side of the transformer is transferred to an output capacitor, via a rectifier diode, as a charging current, and the output voltage rises. By a switching operation of the switching transistor, output voltage of the capacitor charging circuit increases.

Patent Document 1: Japanese Patent Application, Laid-Open No. 2004-201474
Patent Document 2: Japanese Patent Application, Laid-Open No. 2005-73483
Patent Document 3: Japanese Patent Application, Laid-Open No. 2007-165002
Patent Document 4: Japanese Patent Application, Laid-Open No. 2007-166786

Unlike a switching regulator or the like, when the capacitor charging circuit performs a switching operation of the switching transistor, the output voltage continues to increase. Therefore, the capacitor charging circuit has to monitor its output voltage, stop switching when a certain target value is reached, and perform overvoltage protection when a certain threshold is reached.

Here, when the output voltage is monitored, consideration is given to cases in which the output voltage is indirectly monitored using voltage generated by the transformer, rather than directly monitored by resistance voltage division or the like. The voltage that is to be monitored in such cases is synchronous with ON and OFF states of the switching transistor, and alternates between a value corresponding to the output voltage and a value with no relation thereto. Furthermore, since ringing occurs due to an effect of a resonant circuit including a transformer, accurate voltage detection is difficult.

SUMMARY OF THE INVENTION

The present invention has been made in view of this situation, and a general purpose thereof is to provide technology for indirect and accurate detection of voltage corresponding to output voltage of a capacitor charging circuit.

(1) An embodiment of the present invention relates to a control circuit which controls ON and OFF states of a switching transistor arranged on a path of a primary coil of a transformer of a capacitor charging circuit. This control circuit is provided with an output voltage monitoring circuit which monitors output voltage of the capacitor charging circuit. The output voltage monitoring circuit includes a first sample-and-hold circuit which samples and holds voltage of a connection point of the primary coil of the transformer and the switching transistor in an OFF period of the switching transistor, and a first monitoring comparator which compares output of the first sample-and-hold circuit with a predetermined first reference voltage, and when the output of the first sample-and-hold circuit exceeds the first reference voltage, executes predetermined signal processing.

In a period in which the switching transistor is OFF, a voltage that is the output voltage multiplied by the transformer winding ratio is generated at the connection point. Since ringing occurs in the voltage, by using the sample-and-hold circuit it is possible to determine voltage value and to perform stable voltage comparison. Furthermore, since the output of the first sample-and-hold circuit and the first reference voltage are stable voltages that do not vary with time, there is an advantage in that high speed is not required in the comparator.

The first sample-and-hold circuit may start a sampling period after a predetermined first time-period has elapsed after the switching transistor is turned OFF.

By appropriately setting the first time-period, it is possible to reduce effects of ringing and noise, and to increase detection accuracy.

The output voltage monitoring circuit may further include a first delay circuit which delays by the first time-period a switching signal controlling ON and OFF states of the switching transistor. The first sample-and-hold circuit may start a sampling period using output of the first delay circuit.

The output voltage monitoring circuit may further include a third monitoring comparator which compares a voltage drop across a detection resistor arranged on a path of a secondary coil of the transformer, with a predetermined third reference voltage. The first sample-and-hold circuit may end the sampling period when the voltage drop reaches the third reference voltage.

In such cases, by appropriately selecting the third reference voltage, it is possible to set timing at which the sampling period is ended, before the switching transistor is turned ON.

In another embodiment of the present invention the control circuit is provided with an output voltage monitoring circuit which monitors output voltage of a capacitor charging circuit. The output voltage monitoring circuit includes a second sample-and-hold circuit which samples and holds a tap voltage provided in the secondary coil of the transformer, in an OFF period of the switching transistor, and a second monitoring comparator which compares output of the second sample-and-hold circuit with a predetermined second reference voltage. When the output of the second sample-and-hold circuit exceeds the second reference voltage, the control circuit executes predetermined signal processing.

In a period in which the switching transistor is OFF, a voltage that is the result of voltage division being performed on the output voltage, is generated at the tap. Since ringing occurs in the voltage, by using the sample-and-hold circuit it is possible to determine voltage value and to perform a stable voltage comparison. Furthermore, since the output of the second sample-and-hold circuit and the second reference voltage are stable voltages that do not vary with time, there is an advantage in that high speed is not required in the comparator.

The second sample-and-hold circuit may start a sampling period after a predetermined second time-period has elapsed after the switching transistor is turned OFF.

By appropriately setting the second time-period, it is possible to reduce effects of ringing and noise, and to increase detection accuracy.

The output voltage monitoring circuit may further include a second delay circuit which delays by the second time-period a switching signal controlling ON and OFF states of the switching transistor. The second sample-and-hold circuit may start a sampling period using output of the second delay circuit.

The output voltage monitoring circuit may further include a third monitoring comparator which compares a voltage drop across a detection resistor arranged on a path of a secondary coil of the transformer, with a predetermined third reference voltage. The second sample-and-hold circuit may end the sampling period when the voltage drop reaches the third reference voltage.

In such cases, by appropriately selecting the third reference voltage, it is possible to set timing at which the sampling period is ended, before the switching transistor is turned ON.

The output voltage monitoring circuit includes a first sample-and-hold circuit which samples and holds voltage of a connection point of the primary coil of the transformer and the switching transistor, in an OFF period of the switching transistor, and a first monitoring comparator which compares output of the first sample-and-hold circuit with a predetermined first reference voltage. When the output of the first sample-and-hold circuit exceeds the first reference voltage, the control circuit executes predetermined signal processing.

According to this embodiment, since output voltage is detected by using states of both primary and secondary sides and comparing with the reference voltages, even in cases in which detection accuracy of either one deteriorates or detection of either one becomes impossible, it is possible to execute the predetermined signal processing.

It is preferable that the first reference voltage be higher than the second reference voltage. Since detection on the secondary side monitors the output voltage directly, accuracy is higher than for the primary side. Therefore, by having the second reference voltage low, and using the primary side supplementarily, it is possible to assuredly execute the predetermined signal processing.

An even further embodiment of the present invention relates to a method of controlling ON and OFF states of a switching transistor arranged on a path of a primary coil of a transformer of a capacitor charging circuit. The method includes sampling and holding voltage of a connection point of the primary coil of the transformer and the switching transistor, in an OFF period of the switching transistor, and comparing the sampled-and-held voltage of the connection point with a predetermined first reference voltage, and when the sampled-and-held voltage of the connection point exceeds the first reference voltage, stopping switching of the switching transistor.

A sampling period for the voltage of the connection point of the primary coil of the transformer and the switching transistor may be started after a predetermined first time-period has elapsed after the switching transistor is turned OFF.

The method in a certain embodiment may further include comparing a voltage drop across a detection resistor arranged on a path of a secondary coil of the transformer, with a predetermined third reference voltage. The sampling period may be ended when the voltage drop reaches the third reference voltage.

In a still further embodiment of the present invention, a method includes sampling and holding voltage at a tap provided in a secondary coil of the transformer, in an OFF period of the switching transistor, comparing the sampled-and-held tap voltage with a predetermined second reference voltage, and when the sampled-and-held tap voltage exceeds the second reference voltage, stopping switching of the switching transistor.

The sampling period of the tap voltage may be started after a predetermined second time-period has elapsed after the switching transistor is turned OFF.

The method in a certain embodiment may include sampling and holding voltage of a connection point of a primary coil of the transformer and the switching transistor, in an OFF period of the switching transistor, comparing the sampled-and-held voltage of the connection point with a predetermined first reference voltage, and when the sampled-and-held voltage of the connection point exceeds the first reference voltage, executing predetermined signal processing.

The first reference voltage may be higher than the second reference voltage.

(2) An embodiment of the present invention also relates to a control circuit which controls ON and OFF states of a switching transistor arranged on a path of a primary coil of a transformer of a capacitor charging circuit. This control circuit is provided with an output voltage monitoring circuit which monitors output voltage of the capacitor charging circuit. The output voltage monitoring circuit includes a primary monitoring circuit which compares output voltage of the capacitor charging circuit with a predetermined first reference voltage, using voltage generated across the primary coil of the transformer, and a secondary monitoring circuit which compares output voltage of the capacitor charging circuit with a predetermined second reference voltage, using voltage generated across a secondary coil of a transformer, and executes predetermined signal processing based on comparison results of the primary and secondary monitoring circuits.

According to this embodiment, since output voltage is detected by using states of both primary and secondary sides, and comparing with the reference voltages, even in cases in which detection accuracy of either one deteriorates or detection of either one becomes impossible, it is possible to execute the predetermined signal processing.

When the output voltage monitoring circuit judges, by at least one of the primary and the secondary monitoring circuits, that the output voltage has exceeded the respective reference voltage, switching of the switching transistor may be halted.

A tap may be provided in the secondary coil of the transformer, and the secondary monitoring circuit may compare the tap voltage in an OFF period of the switching transistor with voltage corresponding to the second reference voltage.

In a period in which the switching transistor is OFF, a voltage that is the result of voltage division being performed on the output voltage, is generated at the tap. By using this voltage, it is possible to indirectly detect the output voltage.

The secondary monitoring circuit may include a second sample-and-hold circuit which samples and holds a tap voltage of the secondary coil, and a second monitoring comparator which compares output of the second sample-and-hold circuit with voltage corresponding to the second reference voltage.

Since ringing occurs in the voltage generated at the tap, by using the sample-and-hold circuit it is possible to determine voltage value and to perform stable voltage comparison. Furthermore, since the output of the second sample-and-hold circuit and the second reference voltage are stable voltages that do not vary with time, there is an advantage in that high speed is not required in the comparator.

The second sample-and-hold circuit may start a sampling period after a predetermined second time-period has elapsed after the switching transistor is turned OFF.

By appropriately setting the second time-period, it is possible to reduce effects of ringing and noise, and to improve accuracy of detection of the output voltage.

The output voltage monitoring circuit may further include a third monitoring comparator which compares a voltage drop across a detection resistor arranged on a path of the secondary coil of the transformer, with a predetermined third reference voltage. The second sample-and-hold circuit may end the sampling period when the voltage drop reaches the third reference voltage.

In such cases, by appropriately selecting the third reference voltage, it is possible to set timing at which the sampling period is ended, before the switching transistor is turned ON.

The secondary monitoring circuit may compare voltage that is obtained by resistance-dividing output voltage of the capacitor charging circuit with voltage corresponding to the second reference voltage.

In cases in which the output voltage is resistance-divided, since it is possible to detect output voltage regardless of ON or OFF state of the switching transistor, it is possible to execute the predetermined signal processing immediately the output voltage exceeds the reference voltage.

The primary monitoring circuit may include a first sample-and-hold circuit which samples and holds voltage of a connection point of the primary coil and the switching transistor, and a first monitoring comparator which compares output of the first sample-and-hold circuit with voltage corresponding to the first reference voltage.

Since ringing occurs in the voltage generated at the connection point, by using the sample-and-hold circuit it is possible to determine voltage value and to perform stable voltage comparison. Furthermore, since the output of the first sample-and-hold circuit and the first reference voltage are stable voltages that do not vary with time, there is an advantage in that high speed is not required in the comparator.

The first sample-and-hold circuit may sample and hold the voltage of the connection point of the primary coil and the switching transistor after a predetermined first time-period has elapsed after the switching transistor is turned OFF.

By appropriately setting the first time-period, it is possible to reduce effects of ringing and noise, and to improve accuracy of detection of the output voltage.

The output voltage monitoring circuit may further include a third monitoring comparator which compares a voltage drop across a detection resistor arranged on a path of the secondary coil of the transformer, with a predetermined third reference voltage. The first sample-and-hold circuit may end the sampling period, when the voltage drop reaches the third reference voltage.

In such cases, by appropriately selecting the third reference voltage, it is possible to set timing at which the sampling period is ended, before the switching transistor is turned ON.

It is preferable that the first reference voltage be higher than the second reference voltage.

Since detection on the secondary side monitors the output voltage directly, accuracy is higher than for the primary side. Therefore, by having the second reference voltage low, and using the primary side supplementarily, it is possible to assuredly execute the predetermined signal processing.

The second reference voltage may be a voltage corresponding to a fully charged state of a capacitor that is to be charged, and the first reference voltage may be a voltage corresponding to an overvoltage state of the capacitor that is to be charged. The predetermined signal processing may be stopping of switching of the switching transistor.

An even further embodiment of the present invention relates to a method of controlling ON and OFF states of a switching transistor arranged on a path of a primary coil of a transformer of a capacitor charging circuit. The method includes comparing output voltage of the capacitor charging circuit with a predetermined first reference voltage, using voltage generated across a primary coil of a transformer, comparing output voltage of the capacitor charging circuit with a predetermined second reference voltage, using voltage generated across a secondary coil of the transformer, and executing predetermined signal processing when the output voltage exceeds either one of the first or the second reference voltage.

According to this embodiment, since output voltage is detected by using states of both primary and secondary sides, and comparing with the reference voltages, even in cases in which detection accuracy of either one deteriorates or detection of either one becomes impossible, it is possible to execute the predetermined signal processing.

Another embodiment of the present invention is a capacitor charging circuit. The capacitor charging circuit is provided with an output circuit, and the control circuit of any of the abovementioned embodiments. The output circuit includes a transformer, a switching transistor connected to a primary side of the transformer, and an output capacitor arranged on a secondary side of the transformer, and charges the output capacitor by ON and OFF states of the switching transistor. The control circuit controls ON and OFF states of the switching transistor.

An even further embodiment of the present invention is an electronic device. The electronic device is provided with the abovementioned capacitor charging circuit, an imaging section, and a light emitting element, driven by output voltage of the capacitor charging circuit, and used as a flash when an image is taken by the imaging section.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, "a state in which member A is connected to member B" includes cases in which the member A and the member B are directly and physically connected, and cases in which the member A and the member B are indirectly connected via another member that does not affect an electrical connection state.

In a similar way, "a state in which member C is arranged between member A and member B" includes, in addition to cases in which the member A and the member C, or the member B and the member C are directly connected, cases in which the members are indirectly connected via another member that does not affect an electrical connection state.

Furthermore, in the present specification, reference symbols attached to voltage signals, current signals, resistor, or capacitor, represent voltage value, current value, resistance value, or capacitance value thereof, as necessary.

Figure 1:
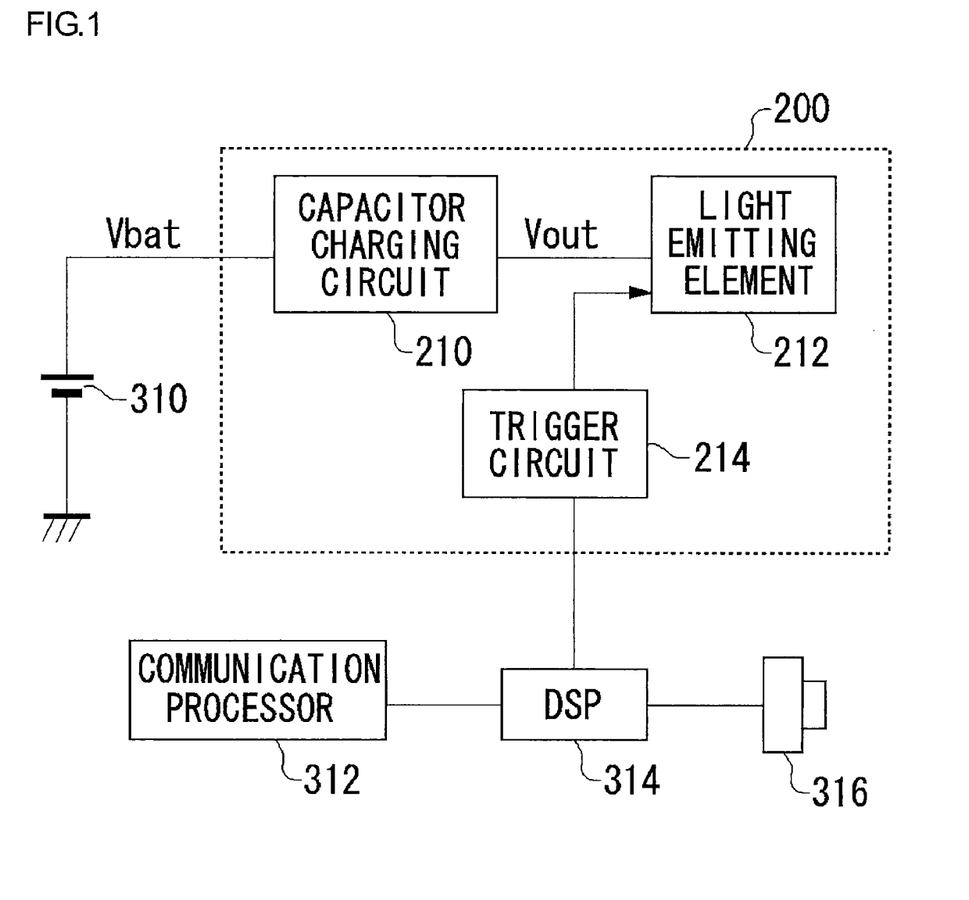
FIG. 1 is a block diagram showing a configuration of an electronic device in which a light emitting device according to an embodiment is installed.

FIG. 1 is a block diagram showing a configuration of an electronic device 300 in which a light emitting device 200 according to an embodiment is installed. The electronic device 300 is a mobile telephone in which a camera is installed, and is provided with a battery 310, a communication processor 312, a DSP (Digital Signal Processor) 314, an imaging section 316, and a light emitting device 200.

The battery 310 is, for example, a lithium-ion battery, and outputs a voltage of approximately 3 to 4 V, as a battery voltage Vbat. The DSP 314 is a block which performs general control of the overall electronic device 300, and is connected to the communication processor 312, the imaging section 316, and the light emitting device 200. The communication processor 312 includes an antenna, a high frequency circuit, and the like, and performs communication with a base station. The imaging section 316 is an imaging device such as a CCD (Charge Coupled Device), a CMOS sensor, or the like. The light emitting device 200 is used as a flash when taking an image with the imaging section 316.

The light emitting device 200 is provided with a capacitor charging circuit 210, a light emitting element 212, and a trigger circuit 214. A xenon tube or the like is preferably used as the light emitting element 212. The capacitor charging circuit 210 is a self excited DC/DC converter, and increases the battery voltage Vbat supplied from the battery 310, and supplies a drive voltage of approximately 300 V to the light emitting element 212. The trigger circuit 214 is a circuit which controls timing of light emission of the light emitting device 200. The light emitting element 212 emits light synchronized with image taking by the image taking section 316.

Figure 2:
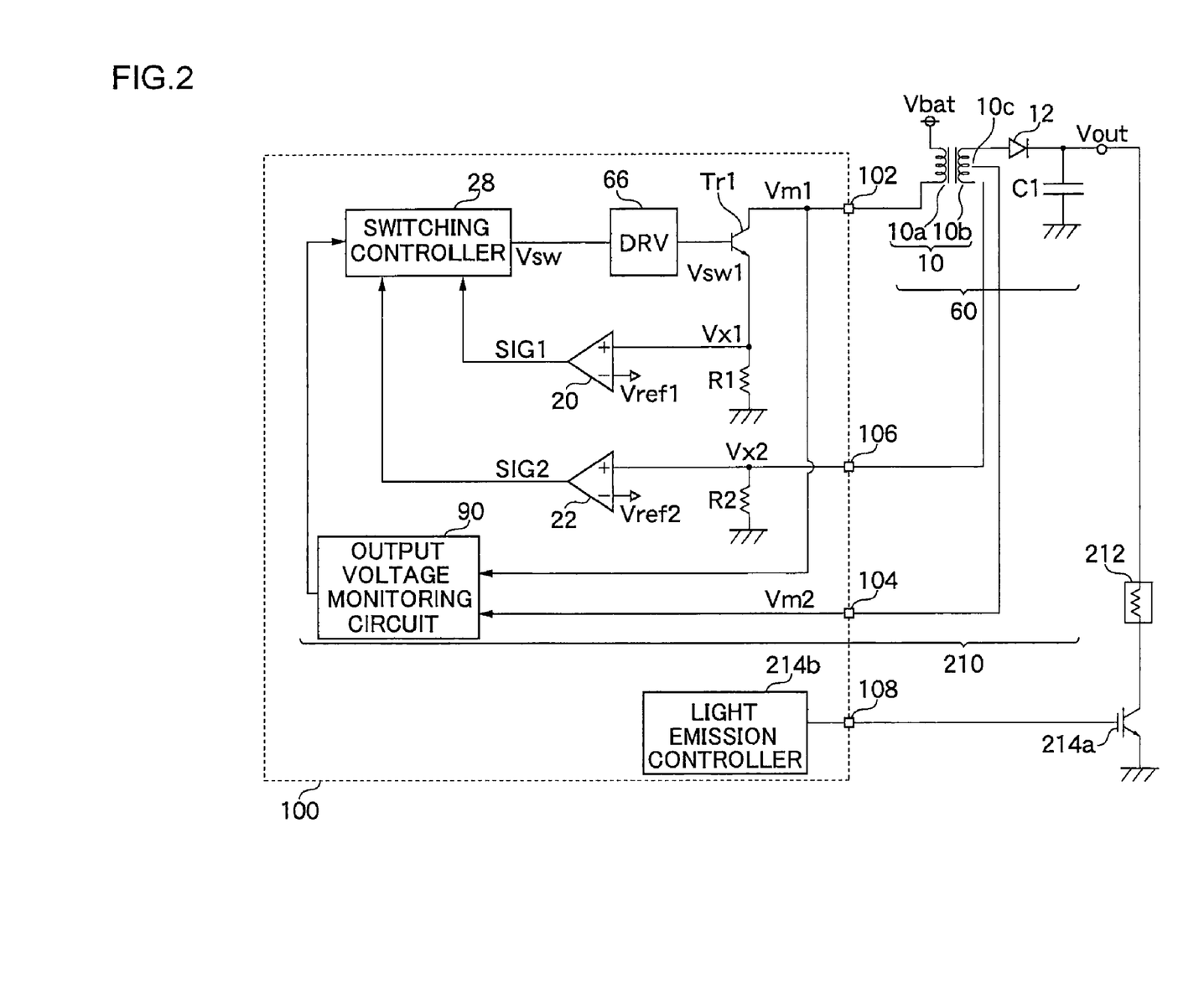
FIG. 2 is a circuit diagram showing a configuration of the light emitting device.

FIG. 2 is a circuit diagram showing a configuration of the light emitting device 200. The light emitting device 200 includes the capacitor charging circuit 210, the light emitting element 212, and an IGBT 214a. The capacitor charging circuit 210 outputs an output voltage Vout obtained by increasing the battery voltage Vbat, to the light emitting element 212. The IGBT 214a is arranged in series with the light emitting element 212. When the IGBT 214a is ON, the light emitting element 212 emits light.

The capacitor charging circuit 210 is provided with a control circuit 100 and an output circuit 60. The output circuit 60 includes a transformer 10, a rectifying diode 12, and an output capacitor C1. An anode of the rectifying diode 12 is connected to one end of a secondary coil 10b of the transformer 10. The output capacitor C1 is arranged between a cathode of the rectifying diode 12 and a ground terminal.

The battery voltage Vbat is applied to one end of a primary coil 10a of the transformer 10, and the other end thereof is connected to an output terminal 102 of the control circuit 100. Furthermore, one end of the secondary coil 10b is connected to a secondary side detection terminal 106.

A tap 10c is arranged in the secondary coil 10b of the transformer 10. The tap 10c is connected to a voltage detection terminal 104.

The control circuit 100 controls ON and OFF states of a switching transistor Tr1 arranged on a path of the primary coil 10a. The switching transistor Tr1 may be arranged as a discrete element exterior to the control circuit 100.

The control circuit 100, in addition to the switching transistor Tr1, is provided with a first resistor R1, a second resistor R2, a first voltage comparator 20, a second voltage comparator 22, a switching controller 28, a driver 66, an output voltage monitoring circuit 90, and a light emission controller 214b.

The light emission controller 214b generates a light emission control signal SIG20, and outputs the signal to the IGBT 214a connected to the light emission control terminal 108. Light emission of the light emitting element 212 is controlled by the light emission control signal SIG20.

The first resistor R1 is arranged on a path of current (primary current Ic1) flowing in the primary coil 10a, one end being grounded and potential being fixed. Specifically, the first resistor R1 is arranged between an emitter of the switching transistor Tr1 and a ground terminal.

The first voltage comparator 20 compares voltage drop generated across the first resistor R1, that is, a first detection voltage Vx1, with a predetermined first threshold voltage Vth1. A first signal SIG1 showing a comparison result has a high level when Vx1>Vth1, and a low level when Vx1<Vth1. The primary current Ic1 is compared with the first threshold current Ith1 given by Vth1/R1, by the first voltage comparator 20.

A second resistor R2 is arranged on a path of current (secondary current Ic2) flowing in the secondary coil 10b, one end being grounded and potential being fixed. The other end of the second resistor R2 is connected to the secondary coil 10b via the secondary side detection terminal 106. The first resistor R1 and the second resistor R2 may be arranged exterior to the control circuit 100.

The second voltage comparator 22 compares voltage drop generated across the second resistor R2, that is, a second detection voltage Vx2, with a predetermined second threshold voltage Vth2. Since the second detection voltage Vx2 is a negative voltage, a voltage obtained by shifting the second detection voltage Vx2 in a positive direction is compared with the threshold voltage. The secondary current Ic2 is compared with the second threshold current Ith2, by the second voltage comparator 22.

The first signal SIG1 and the second signal SIG2 are inputted to the switching controller 28. The switching controller 28 generates a switching signal Vsw in which level transits according to the first signal SIG1 and the second signal SIG2.

When the first detection voltage Vx1 exceeds the first threshold voltage Vth1, that is, the current Ic1 flowing in the primary coil of the transformer 10 reaches the first threshold current Ith1, the switching controller 28 turns the switching transistor Tr1 OFF. Furthermore, when the second detection voltage Vx2 exceeds the second threshold voltage Vth2, that is, the current Ic2 flowing in the secondary coil of the transformer 10 decreases as far as the second threshold current Ith2≈0 A, a logic section 30 turns the switching transistor Tr1 ON.

When the primary current Ic1 reaches the first threshold current Ith1, the switching signal Vsw goes to a first level (low level), and when the secondary current Ic2 decreases to the second threshold current Ith2, the switching signal Vsw goes to a second level (high level). The driver 66 switches the switching transistor Tr1 ON and OFF based on a signal Vsw1 corresponding to the switching signal Vsw. The switching transistor Tr1 is ON when the switching signal Vsw1 has a high level, and is OFF when the switching signal Vsw1 has a low level.

When the output voltage Vout exceeds a predetermined reference voltage, the output voltage monitoring circuit 90 executes predetermined signal processing. For example, the output voltage monitoring circuit 90 is a full-charge detection circuit which detects a fully charged state of the output capacitor C1, and when the output voltage Vout exceeds the reference voltage, stops switching of the switching transistor Tr1. Alternatively, the output voltage monitoring circuit 90 is an overcharge detection circuit which detects an overcharged state of the output capacitor C1, and when the output voltage Vout exceeds the reference voltage, stops switching of the switching transistor Tr1.

A first monitoring voltage Vm1 generated on the primary coil 10a side of the transformer 10, and a second monitoring voltage Vm2 generated on the secondary coil 10b side are inputted to the output voltage monitoring circuit 90. Each of the first monitoring voltage Vm1 and the second monitoring voltage Vm2 is a voltage that has a correlation with the output voltage Vout.

Figure 3:
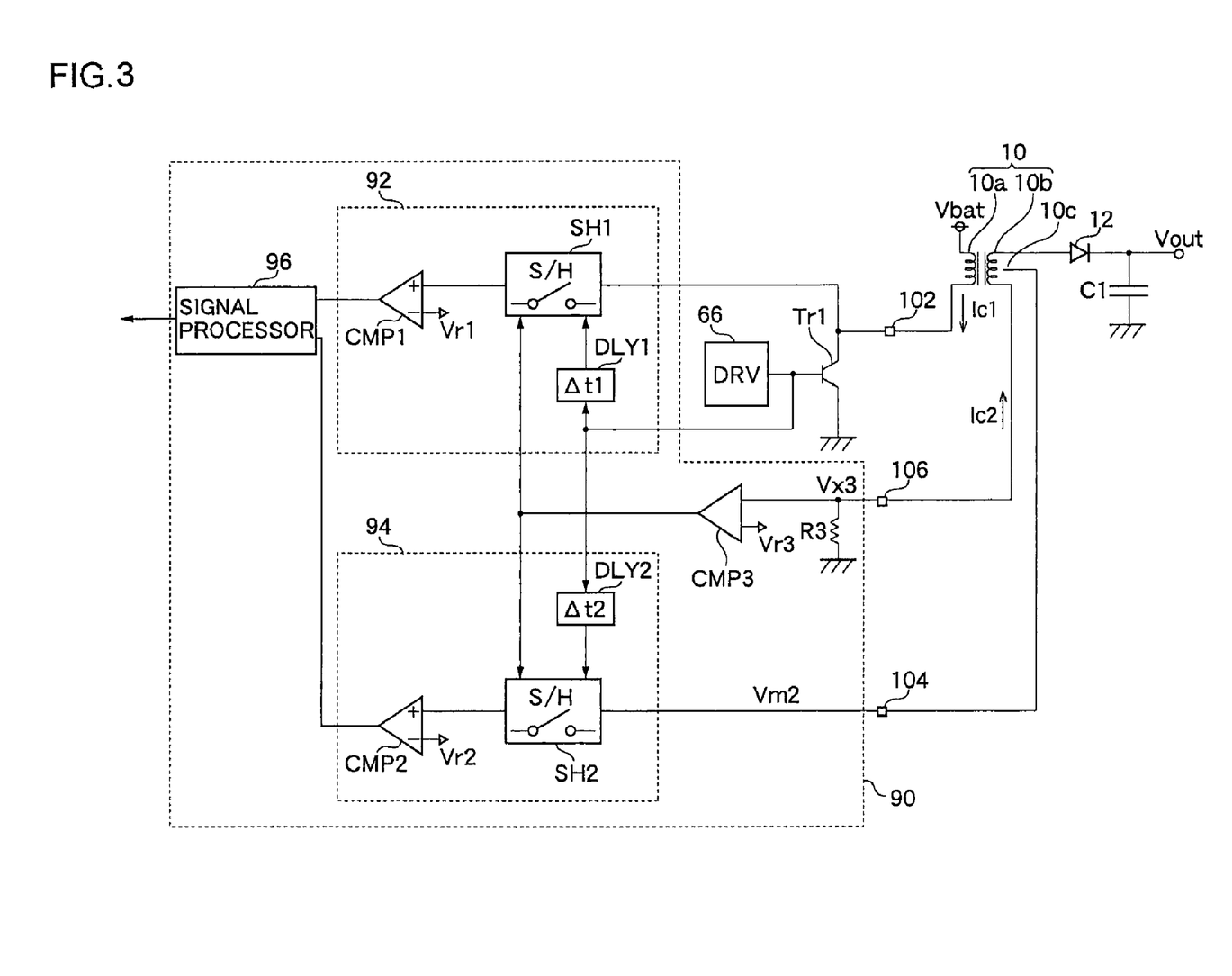
FIG. 3 is a circuit diagram showing a configuration of an output voltage monitoring circuit.

FIG. 3 is a circuit diagram showing a configuration of the output voltage monitoring circuit 90. The output voltage monitoring circuit 90 is provided with a primary monitoring circuit 92, a secondary monitoring circuit 94, and a signal processor 96.

The primary monitoring circuit 92 uses the voltage Vm1 generated on the primary coil 10a side of the transformer 10, to compare the output voltage Vout of the capacitor charging circuit 210 with the predetermined first reference voltage Vref1. The secondary monitoring circuit 94 uses the second monitoring voltage Vm2 generated on the secondary coil 10b side of the transformer 10, to compare the output voltage Vout of the capacitor charging circuit 210 with a predetermined second reference voltage Vref2.

The signal processor 96 executes predetermined signal processing based on comparison results of the primary monitoring circuit 92 and the secondary monitoring circuit 94. The predetermined signal processing is discretionary, and the following description is such that the signal processor 96 executes processing for cases of full charge or of overcharge. When it is judged that the output voltage Vout has exceeded the respective reference voltages Vref1 and Vref2, by at least one of the primary monitoring circuit 92 and the secondary monitoring circuit 94, the signal processor 96 stops switching of the switching transistor Tr1.

In this way, when the predetermined signal processing is performed according to the output voltage, by carrying out double detection on the primary side and the secondary side of the transformer 10, even in cases in which detection accuracy of either one deteriorates, or detection by either one is impossible, it is possible to execute the predetermined signal processing.

The first reference voltage Vref1 is preferably higher than the second reference voltage Vref2. For example, the second reference voltage Vref2 may be a voltage (300 V) corresponding to a fully charged state of the output capacitor C1 that is to be charged, and the first reference voltage Vref1 may be a voltage corresponding to an overvoltage state (330 V) of the output capacitor C1 that is to be charged. Since the secondary side is closer to the output capacitor C1, detection accuracy is higher in many cases. Therefore, by setting the reference voltage Vref2 of the secondary side to be low, and using the primary side supplementarily, it is possible to assuredly perform the signal processing.

A description is given below concerning monitoring of a specific output voltage Vout by the output voltage monitoring circuit 90.

A tap 10c is arranged in the secondary coil 10b of the transformer 10. The secondary monitoring circuit 94 compares the voltage Vm2 of the tap 10c (below, referred to as the tap voltage), in an OFF period of the switching transistor Tr1, with the voltage Vr2 corresponding to the second reference voltage Vref2 (below, Vr2 is referred to as the second reference voltage). A voltage proportional to a winding ratio, divided internally at the tap 10d is generated in the tap 10c. For example, in cases in which the tap 10c is arranged at a position at which the winding ratio is 9:1, the tap voltage Vm2 is 1/10 of the output voltage Vout.

When a charging current flows in the secondary coil 10b, that is, in an OFF period of the switching transistor Tr1, the tap voltage Vm2 has a value corresponding to the output voltage Vout. Furthermore, ringing due to switching of the switching transistor Tr1 occurs in the tap voltage Vm2. Consequently, by using a sample-and-hold circuit, the secondary monitoring circuit 94 determines voltage value, and performs stable voltage comparison.

The secondary monitoring circuit 94 includes a second sample-and-hold circuit SH2, a second monitoring comparator CMP2, and a second delay circuit DLY2.

The second sample-and-hold circuit SH2 samples and holds the tap voltage Vm2. The second monitoring comparator CMP2 compares output of the second sample-and-hold circuit SH2 with the second reference voltage Vr2. In cases in which the tap voltage Vm2 is high, the second monitoring comparator CMP2 may divide the tap voltage Vm2, and make a comparison with the second reference voltage Vr2.

In this configuration, since the output of the second sample-and-hold circuit SH2 and the second reference voltage Vr2 are stable voltages that do not change with time, there is an advantage in that high speed is not required in the second monitoring comparator CMP2.

Next, a description is given of a sample-and-hold operation by the second sample-and-hold circuit SH2.

The second sample-and-hold circuit SH2 starts a sampling period after a predetermined second time-period Δt2 has elapsed after the switching transistor Tr1 is turned OFF. The second delay circuit DLY2 delays the switching signal Vsw controlling ON and OFF states of the switching transistor Tr1 by the second time-period Δt2. The second sample-and-hold circuit SH2 uses output of the second delay circuit DLY2 to start the sampling period.

Immediately after the switching transistor Tr1 is turned OFF, the tap voltage Vm2 has an unstable value due to ringing. Consequently, by performing a sampling operation at timing at which ringing has settled after the second time-period Δt2 has elapsed, it is possible to increase accuracy of detection of the output voltage Vout.

A detection resistor R3 is arranged on a path of the secondary coil lob of the transformer 10, and a voltage drop Vx3 proportional to the secondary current Ic2 is generated in the detection resistor R3. A third monitoring comparator CMP3 compares the voltage drop Vx3 with a predetermined third reference voltage Vr3. The third reference voltage Vr3 is set to a negative value close to 0 V. The second sample-and-hold circuit SH2 refers to output of the third monitoring comparator CMP3, and when the voltage drop Vx3 reaches the third reference voltage Vr3, ends the sampling period. By appropriately selecting the third reference voltage Vr3, it is possible to set timing at which the sampling period is ended, before the switching transistor Tr1 is turned ON. The secondary monitoring circuit 94 is configured as above.

Next a description is given concerning the primary monitoring circuit 92.

The primary monitoring circuit 92 includes the first monitoring comparator CMP1, the first sample-and-hold circuit SH1, and the first delay circuit DLY1.

The first sample-and-hold circuit SH1 samples and holds the first monitoring voltage Vm1 of a connection point of the primary coil 10a and the switching transistor Tr1. The first monitoring comparator CMP1 compares output of the first sample-and-hold circuit SH1 with a voltage Vr1 corresponding to the first reference voltage Vref1 (Vr1 is referred to below as the first reference voltage). In cases in which the first monitoring voltage Vm1 is high, the first monitoring comparator CMP1 divides the first monitoring voltage Vm1, and makes a comparison with the first reference voltage Vr1. Further, a well known circuit may be used for the first sample-and-hold circuit SH1.

In cases in which the sample-and-hold circuit is not provided, and the first monitoring voltage Vm1 is monitored only for a predetermined period for the first monitoring comparator CMP1, it is necessary to switch between ON and OFF of the first monitoring comparator CMP1 at high speed, and circuit design is difficult.

With regard to this, in the present embodiment, since the output of the first sample-and-hold circuit SH1 and the first reference voltage Vr1 are stable voltages that do not vary with time, there is an advantage in that high speed is not required in the first monitoring comparator CMP1.

Next, a description is given of a sample-and-hold operation by the first sample-and-hold circuit SH1.

The first sample-and-hold circuit SH1 starts a sampling period after a predetermined first time-period $\Delta t1$ has elapsed after the switching transistor Tr1 is turned OFF. The first delay circuit DLY1 delays the switching signal Vsw by the first time-period $\Delta t1$. The first sample-and-hold circuit SH1 uses output of the first delay circuit DLY1 to start a sampling period.

Immediately after the switching transistor Tr1 is turned OFF, the first monitoring voltage Vm1 has an unstable value due to ringing. Consequently, by performing a sampling operation at timing at which ringing has settled, after the first time-period $\Delta t1$ has elapsed, it is possible to increase accuracy of detection of the output voltage Vout.

Further, it is preferable that the first delay time-period $\Delta t1$ and the second delay time-period $\Delta t2$ be individually adjustable. This is because ringing duration is different for the voltages Vm1 and Vm2.

The first sample-and-hold circuit SH1 refers to output of the third monitoring comparator CMP3, and when the voltage drop Vx3 reaches the third reference voltage Vr3, ends the sampling period. This operation is similar to the secondary side.

Figure 4:
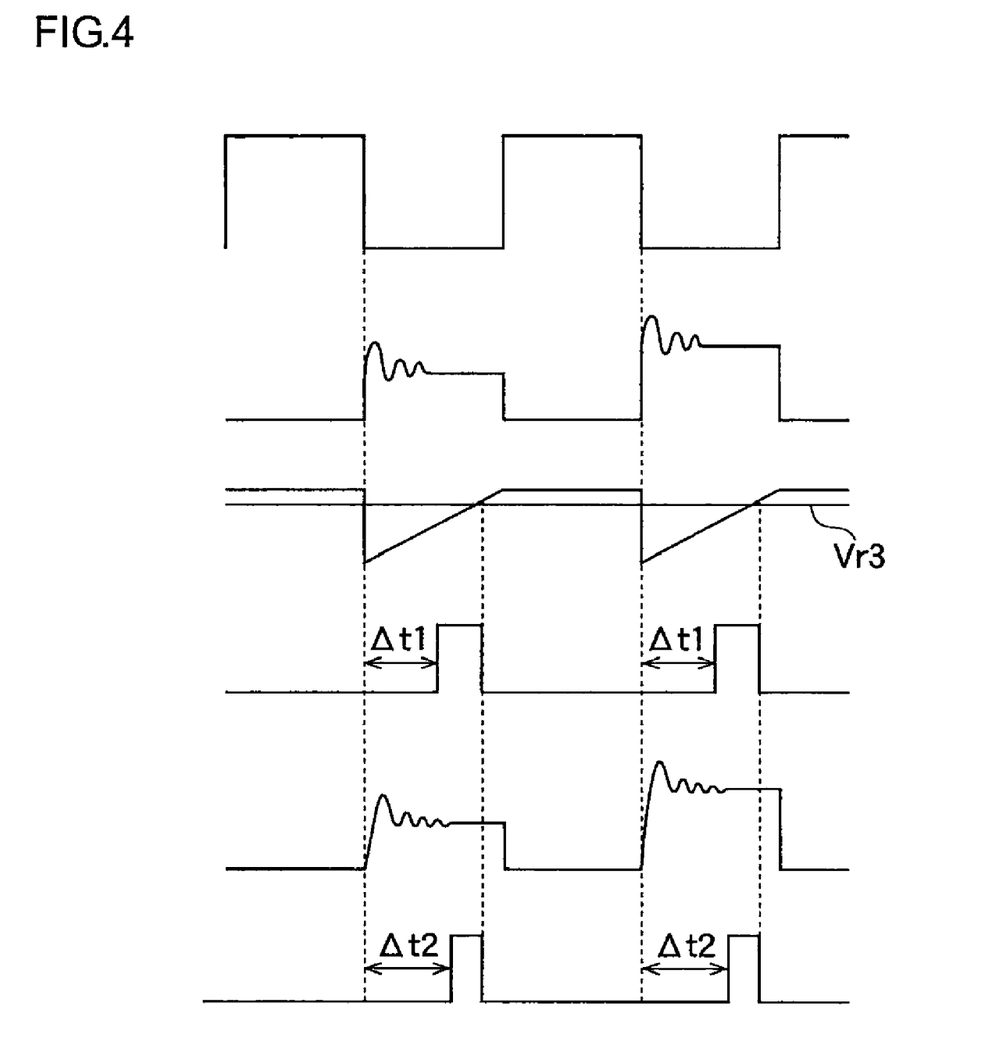
FIG. 4 is a time chart showing operation of a control circuit of FIG. 3.

A description will be given of operation of the control circuit 100 configured as above. FIG. 4 is a time chart showing operation of the control circuit 100 of FIG. 3.

The switching signal Vsw transits from a high level to a low level, and the switching transistor Tr1 is OFF. A negative edge of the switching signal Vsw is delayed by the first time-period $\Delta t1$ by the first delay circuit DLY1, and a sampling period of the first sample-and-hold circuit SH1 starts. After that, when the voltage drop Vx3 across the detection resistor R3 reaches the third reference voltage Vr3, the sampling period is ended. By this sampling operation, voltage level of output of the first sample-and-hold circuit SH1 approaches the first monitoring voltage Vm1 that is proportional to the output voltage Vout. In each repetition of switching of the switching transistor Tr1, the output voltage Vout increases, and in correspondence thereto, the first monitoring voltage Vm1 also increases. At a certain timing, when the output of the first sample-and-hold circuit SH1 reaches the first reference voltage Vr1, the switching operation of the switching transistor Tr1 stops.

A similar operation is performed on the secondary side in parallel to the primary side. A negative edge of the switching signal Vsw is delayed by the second time-period $\Delta t2$ by the second delay circuit DLY2, and a sampling period of the second sample-and-hold circuit SH2 starts. After that, when the voltage drop Vx3 across the detection resistor R3 reaches the third reference voltage Vr3, the sampling period is ended. That is, in the time chart of FIG. 4, for the sampling periods of the first sample-and-hold circuit SH1 and the second sample-and-hold circuit SH2, end timings are set to be identical. On the other hand, the first time-period $\Delta t1$ and the second time-period $\Delta t2$ corresponding to start timing of the sampling periods, are set giving consideration to ringing time-periods of each of the voltages Vm1 and Vm2.

The abovementioned embodiment is an example, and a person skilled in the art will understand that various modified examples in combinations of various component elements and various processes thereof are possible, and that such modified examples are within the scope of the present invention.

One feature of the control circuit 100 according to the embodiment is double detection of output voltage by monitoring the voltages on the primary side and the secondary side of the transformer 10. From this viewpoint, modified examples (a) and (b) below are included in the present invention.

(a) In the circuit of FIG. 2, the secondary monitoring circuit 94 monitors voltage of the tap 10c of the secondary side of the transformer 10, but instead of this, a voltage obtained by resistance-dividing the output voltage Vout of the capacitor charging circuit 210 may be compared with the second reference voltage Vr2. In such cases, since the divided voltage always has a value proportional to the output voltage Vout, a sample-and-hold circuit is not necessary.

(b) Furthermore, the first reference voltage Vref1 may be set lower than the second reference voltage Vref2.

Another feature of the control circuit 100 according to the embodiment is the point that a voltage value, being a voltage generated on the primary side or the secondary side of the transformer 10, having a value correlated to the output voltage Vout intermittently, is sampled and held, and this is compared with a threshold voltage. From this viewpoint, modified examples (c) and (d) below are included in the present invention.

(c) In the circuit of FIG. 3, states of the primary side and the secondary side are doubly detected by the primary monitoring circuit 92 and the secondary monitoring circuit 94, but monitoring of only one thereof is possible. Or, in cases of monitoring the secondary side by resistance-dividing the output voltage Vout, the second sample-and-hold circuit SH2 of the secondary side may be omitted.

(d) The third monitoring comparator CMP3 may be in common with the second voltage comparator 22, and in addition, the detection resistor R3 may be in common with the second resistor R2. Each of the second resistor R2 and the detection resistor R3 are arranged on a path of the secondary current Ic2 flowing in the secondary coil 10b, and the third monitoring comparator CMP3 and the second voltage comparator 22 have shared functionality in comparing voltage drop across the resistors, with a threshold voltage. Therefore, by having these resistors and comparators in common, circuit area can be reduced.

Furthermore, technology of monitoring the output voltage can be applied for both self-excited and separately excited cases.

In the embodiment, cases in which the capacitor charging circuit 210 drives the light emitting element 212 were described, but there is no limitation thereto, and it is possible to drive various types of other load circuits requiring high voltage.

While the preferred embodiments of the present invention have been described using specific terms, such description is for illustrative purposes only, and it is to be understood that changes and variations may be made without departing from the spirit or scope of the appended claims.

What is claimed is:

1. A control circuit for controlling ON and OFF states of a switching transistor arranged on a path of a primary coil of a transformer of a capacitor charging circuit, the control circuit comprising:
an output voltage monitoring circuit which monitors output voltage of the capacitor charging circuit; wherein
the output voltage monitoring circuit includes
a first sample-and-hold circuit which samples and holds voltage of a connection point of the primary coil of the transformer and the switching transistor, in an OFF period of the switching transistor; and
a first monitoring comparator which compares output of the first sample-and-hold circuit with a predetermined first reference voltage;
and when the output of the first sample-and-hold circuit exceeds the first reference voltage, executes predetermined signal processing, wherein the first sample-and-hold circuit starts a sampling period after a predetermined first time-period has elapsed after the switching transistor is turned OFF, and wherein
the output voltage monitoring circuit further includes a first delay circuit which delays by the first time-period a switching signal controlling ON and OFF states of the switching transistor; and
the first sample-and-hold circuit uses output of the first delay circuit to start a sampling period.

2. A control circuit for controlling ON and OFF states of a switching transistor arranged on a path of a primary coil of a transformer of a capacitor charging circuit, the control circuit comprising:
an output voltage monitoring circuit which monitors output voltage of the capacitor charging circuit; wherein
the output voltage monitoring circuit includes
a first sample-and-hold circuit which samples and holds voltage of a connection point of the primary coil of the transformer and the switching transistor, in an OFF period of the switching transistor; and
a first monitoring comparator which compares output of the first sample-and-hold circuit with a predetermined first reference voltage;
and when the output of the first sample-and-hold circuit exceeds the first reference voltage, executes predetermined signal processing, and wherein
the output voltage monitoring circuit further includes a third monitoring comparator which compares a voltage drop across a detection resistor arranged on a path of a secondary coil of the transformer, with a predetermined third reference voltage; and
the first sample-and-hold circuit ends a sampling period when the voltage drop reaches the third reference voltage.

3. A control circuit for controlling ON and OFF states of a switching transistor arranged on a path of a primary coil of a transformer of a capacitor charging circuit, the control circuit comprising:
an output voltage monitoring circuit which monitors output voltage of the capacitor charging circuit; wherein
the output voltage monitoring circuit includes
a second sample-and-hold circuit which samples and holds voltage of a tap provided in a secondary coil of the transformer, in an OFF period of the switching transistor; and
a second monitoring comparator which compares output of the second sample-and-hold circuit with a predetermined second reference voltage;
and when the output of the second sample-and-hold circuit exceeds the second reference voltage, executes predetermined signal processing, and wherein the second sample-and-hold circuit starts a sampling period after a predetermined second time-period has elapsed after the switching transistor is turned OFF, and wherein
the output voltage monitoring circuit further includes a second delay circuit which delays by the second time-period a switching signal controlling ON and OFF states of the switching transistor; and
the second sample-and-hold circuit uses output of the second delay circuit to start a sampling period.

4. A control circuit for controlling ON and OFF states of a switching transistor arranged on a path of a primary coil of a transformer of a capacitor charging circuit, the control circuit comprising:
an output voltage monitoring circuit which monitors output voltage of the capacitor charging circuit; wherein
the output voltage monitoring circuit includes
a second sample-and-hold circuit which samples and holds voltage of a tap provided in a secondary coil of the transformer, in an OFF period of the switching transistor; and
a second monitoring comparator which compares output of the second sample-and-hold circuit with a predetermined second reference voltage;
and when the output of the second sample-and-hold circuit exceeds the second reference voltage, executes predetermined signal processing, and wherein
the output voltage monitoring circuit further includes a third monitoring comparator which compares a voltage drop across a detection resistor arranged on a path of the secondary coil of the transformer, with a predetermined third reference voltage; and
the second sample-and-hold circuit ends a sampling period when the voltage drop reaches the third reference voltage.

5. The control circuit according to claim 4, wherein the output voltage monitoring circuit further includes
a first sample-and-hold circuit which samples and holds voltage of a connection point of the primary coil of the transformer, and the switching transistor, in an OFF period of the switching transistor; and
a first monitoring comparator which compares output of the first sample-and-hold circuit with a predetermined first reference voltage;
and when the output of the first sample-and-hold circuit exceeds the first reference voltage, executes predetermined signal processing.

6. The control circuit according to claim 5, wherein the first reference voltage is higher than the second reference voltage.

7. A method of controlling ON and OFF states of a switching transistor arranged on a path of a primary coil of a transformer of a capacitor charging circuit, the method comprising:

sampling and holding voltage of a connection point of the primary coil of the transformer and the switching transistor in an OFF period of the switching transistor;

comparing the sampled-and-held voltage of the connection point with a predetermined first reference voltage; and when the sampled-and-held voltage of the connection point exceeds the first reference voltage, executing predetermined signal processing, wherein a sampling period for the voltage of the connection point of the primary coil of the transformer and the switching transistor is started after a predetermined first time-period has elapsed after the switching transistor is turned OFF, and the method further comprises:

comparing a voltage drop across a detection resistor arranged on a path of a secondary coil of the transformer, with a predetermined third reference voltage; wherein when the voltage drop reaches the third reference voltage, the sampling period is ended.

8. A method of controlling ON and OFF states of a switching transistor arranged on a path of a primary coil of a transformer of a capacitor charging circuit, the method comprising:

sampling and holding voltage of a tap provided in a secondary coil of the transformer, in an OFF period of the switching transistor;

comparing the sampled-and-held tap voltage with a predetermined second reference voltage; and when the sampled-and-held tap voltage exceeds the second reference voltage, executing predetermined signal processing, and wherein a sampling period of the tap voltage is started after a predetermined second time-period has elapsed after the switching transistor is turned OFF, and wherein the method further comprises:

comparing a voltage drop across a detection resistor arranged on a path of the secondary coil of the transformer, with a predetermined third reference voltage; wherein when the voltage drop reaches the third reference voltage, the sampling period is ended.

9. The method according to claim 8, further comprising:

sampling and holding voltage of a connection point of the primary coil of the transformer and the switching transistor, in an OFF period of the switching transistor;

comparing the sampled-and-held voltage of the connection point with a predetermined first reference voltage; and when the sampled-and-held voltage of the connection point exceeds the first reference voltage, executing predetermined signal processing.

10. The method according to claim 9, wherein the first reference voltage is higher than the second reference voltage.

* * * * *